United States Patent [19]

Nakauchi et al.

[11] Patent Number: 5,373,254
[45] Date of Patent: Dec. 13, 1994

[54] METHOD AND APPARATUS FOR CONTROLLING PHASE OF A SYSTEM CLOCK SIGNAL FOR SWITCHING THE SYSTEM CLOCK SIGNAL

[75] Inventors: Toshihiko Nakauchi; Masato Hirai; Masami Kurata, all of Hadano, Japan

[73] Assignees: Hitachi, Ltd., Tokyo; Hitachi Computer Engineering Co., Ltd., Kanagawa, both of Japan

[21] Appl. No.: 5,034

[22] Filed: Jan. 15, 1993

[30] Foreign Application Priority Data

Jan. 17, 1992 [JP] Japan ................... 4-006751

[51] Int. Cl.⁵ .......... H03L 7/00; H03L 7/06; H03L 7/08; H03L 7/14
[52] U.S. Cl. .................. 331/1 A; 331/14; 331/18; 331/25; 331/49
[58] Field of Search .............. 331/49, 1 A, 2, 14, 331/18, 25, 108 C, DIG. 2; 360/38.1

[56] References Cited

U.S. PATENT DOCUMENTS

| | | | |
|---|---|---|---|
| 5,089,793 | 2/1992 | Nagao | 331/49 X |
| 5,122,677 | 6/1992 | Sato | 331/49 X |
| 5,142,247 | 8/1992 | Lada, Jr. et al. | 331/49 X |
| 5,235,292 | 8/1993 | Endo et al. | 331/49 |

FOREIGN PATENT DOCUMENTS 1-180151 7/1989 Japan.

Primary Examiner—David Mis
Attorney, Agent, or Firm—Antonelli, Terry, Stout & Kraus

[57] ABSTRACT

A method and apparatus for controlling the phase of a system clock, in which one of a first clock signal and a second clock signal is selected and output to a system as a system clock signal, the first clock signal being generated by a frequency synthesizer synchronized with an external clock signal supplied from a reference clock signal oscillator provided externally of the system, and the second clock signal being supplied from another reference clock signal oscillator provided internally of the system, and the phases of the first and second clock signals are controlled, prior to switching between the first and second clock signals and supplying the switched clock signal to the system as the system clock signal. The switching is delayed for a period while there is a phase shift between the first and second clock signal, when the system clock signal is switched between the first and second clock signal.

33 Claims, 8 Drawing Sheets

METHOD AND APPARATUS FOR CONTROLLING PHASE OF A SYSTEM CLOCK SIGNAL FOR SWITCHING THE SYSTEM CLOCK SIGNAL

BACKGROUND OF THE INVENTION

1. Field of the Invention

The present invention relates to a method and apparatus for controlling the phase of a system clock that is synchronized with an external clock, and more particularly to a method and apparatus for controlling the phase of a system clock when an external clock is intercepted or recovered.

2. Description of the Related Art

There is known an effective conventional means for synchronizing a network such as a local area network (LAN) with a public digital network of NTT or the like connected to LAN. With this means, an external clock is supplied to a phase-locked loop (PLL) and frequency-divided to 8 kHz which is the greatest common divisor between 1.544 Mbps of a high speed digital interface of the public digital network and 2.028 Mbps of a PBX interface of LAN. This 8 kHz signal phase-locked in PLL is supplied as clock information to each node of LAN, after high frequency jitters (fluctuation at clock edges) are eliminated at PLL.

FIG. 1 is a block diagram showing an example of the circuit structure of PLL. Reference numeral 21 represents a phase comparator, reference numeral 22 represents a low-pass filter (LPF), reference numeral 23 represents a voltage-controlled oscillator (VCO), and reference numeral 24 represents a frequency divider having a division ratio N (N is an integer).

In PLL shown in FIG. 1, the phase comparator 21 compares the phase of a clock 38 supplied from the external network to that of an output of the frequency divider 24 (this output is called a PLL output clock, hereinafter where applicable). An output 27 of the phase comparator 21 is smoothed by LPF 22 and output as a voltage signal 28 which controls VCO 23 to oscillate a predetermined frequency signal 29.

VCO 23 is an oscillator whose oscillation frequency is controlled by a voltage 28 output from LPF 22. The frequency of an output 29 of VCO 23 is divided by N by the frequency divider 24. An output 25 of the frequency divider 24 is used as a system clock of LAN (not shown) if the external clock is normal.

In PLL described above, if the frequency of VCO 23 changes the frequency of the PLL output clock 25 also changes. However, this frequency change reduces the output 27 of the phase comparator 21 so that the phase difference between the clock 38 from the external network and the PLL output clock 25 gradually reduces to eventually synchronize both of the clocks. The frequency of the VCO output is generally set N (an arbitrary integer) times as high as that of the clock from the external network.

If the clock 38 from the external network is not supplied to PLL, the output 29 of VCO 23 takes its self-running oscillation frequency. The self-running oscillation frequency of VCO 23 has, in some cases a shift of 10% or more from that under the phase-locked state. In this case, the PLL output clock 25 from the frequency divider 24 also has the shift of 10% or more, and is difficult to be used as the system clock.

Even when the clock 38 from the external network is not supplied, the system is requested to maintain communications within the LAN. Therefore, it is necessary to provide the system clock with the compensated frequency shift even when the external clock is intercepted.

A conventional technique for satisfying such conditions is known as described, for example, in JP-A-1-180151.

FIG. 2 is a block diagram showing the circuit of this conventional technique. Reference numeral 30 represents an internal clock standard oscillator, reference numeral 41 represents a selector, and reference numeral 54 represents an external clock interception detector. Other elements are similar to those shown in FIG. 1 and represented by identical reference numerals, and so the description thereof is omitted.

The conventional technique illustrated in FIG. 2 has the internal clock standard oscillator 30, external clock interception detector 54, and selector 41 for selecting one of the external and internal clocks, respectively added to PLL shown in FIG. 1.

If the external clock 38 is intercepted, the external clock interception detector 54 detects this interception and inputs the clock interception information to the selector 41 connected to the front stage of the phase comparator 21. The selector 41 then selects the internal clock 37 instead of the external clock 38.

Since the internal clock 37 phase-locked by PLL has no frequency shift, it can be used as the system clock even when the external clock is intercepted. Furthermore, when the external clock is recovered, clock recovery information is supplied from the external clock interception detector 54 to the selector 41 at the front stage of the phase comparator 21. The selector 41 then selects the external clock 38 instead of the internal clock 37, to synchronize the PLL output clock or system clock with the external clock.

The above-described conventional technique eliminates the frequency shift of the PLL output clock when the external clock is intercepted. However, the phase control is not made at the time of switching from the external clock 38 to the internal clock 37 or vice versa, posing a problem of a phase step of 180 degrees at a maximum.

Therefore, communications within the LAN are temporarily disturbed in some cases, and terminal equipment at each node of LAN is unable to communicate temporarily. This communication disabled period adversely affects terminal equipment, particularly, those equipment requiring real time operation. In addition, as the scale of LAN becomes large, the number of nodes increases so that the communication disable state propagates to the wide range of LAN.

SUMMARY OF THE INVENTION

It is an object of the present invention to provide a method and apparatus for controlling the phase of a system clock, eliminating the above-described prior art disadvantages.

It is another object of the present invention to provide a method and apparatus for controlling the phase of stably a system clock, capable of maintaining both the frequency and phase of the system clock when a clock from an external network is intercepted or recovered.

According to one aspect of the present invention, a phase controlling apparatus for controlling the phase of a system clock includes a selecting unit for selecting one of a first clock and a second clock and outputting the selected clock to a system as a system clock. The first clock is generated by a frequency synthesizer synchronized with an external clock supplied from a standard clock oscillator provided externally of the system, and the second clock is supplied from a standard clock oscillator provided internally of the system. The phase controlling apparatus further includes a phase controlling unit for supplying the first and second clocks to the selecting unit after controlling the phases of the first and second clocks, when the system clock is switched by the selecting between the first and second clocks.

According to another aspect of the present invention, a phase controlling apparatus for controlling the phase of a system clock includes a phase-locked loop having a phase comparator, a low-pass filter, a voltage-controlled oscillator, and a frequency divider. The phase-locked loop generates a first clock synchronized with a clock generated from an external clock supplied from a standard clock oscillator provided externally of a system, and outputs the first clock to the system. The apparatus further includes a selecting unit for selecting one of the first clock and a second clock and outputting the selected one to the system as a system clock, wherein the second clock being generated from an internal clock generated by a standard clock oscillator provided internally of the system, and a phase controlling unit for supplying the first and second clocks to the selecting unit after controlling the phases of the first and second clocks, when the system clock is switched by the selecting unit between the first and second clocks.

In the phase controlling apparatus constructed as above, the phases of the first and second clocks are controlled when the system clock is switched, reducing a phase shift (step) on the system clock when switching clock is switched by the selecting unit between the first and second clocks.

Preferably, the delay unit generates a signal having a mask width corresponding to the period while there is a phase shift between the first and second clocks, when the system clock is switched by the selecting unit between the first and second clocks, and delays the switching by the selecting unit for the period in response to the signal.

It becomes possible therefore to prevent a glitch on the system clock from being caused by a phase shift between the first and second clocks at the time of switching between the first and second clocks.

Preferably, in response to an interception of the external clock, the selecting unit is controlled to select the second clock instead of the first clock and output the second clock as the system clock.

Preferably, in response to a recovery of the external clock, the selecting unit is controlled to select the first clock instead of the second clock and output the first clock as the system clock.

Preferably, the phase controlling apparatus further includes a first frequency divider provided between the standard clock oscillator provided internally of the system and the selecting unit, for frequency-dividing the internal clock to obtain the second clock, a second frequency divider for frequency-dividing the external clock supplied from the standard clock oscillator provided externally of the system, and a selector for selecting one of the clocks output from the first and second frequency divider and supplying the selected one to the phase-locked loop, wherein the phase-locked loop as a frequency synthesizer generates the first clock synchronized with the clock selected by the selector, and outputting the first clock to the system.

Preferably, the phase controlling unit causes the count of the first frequency divider to match the count of the frequency divider of the phase-locked loop, when the selecting unit selects the first clock as the system clock, and causes the count of the second frequency divider to match the count of the frequency divider of the phase-locked loop, when the selecting unit selects the second clock as the system clock.

According to the phase controlling apparatus of the present invention constructed as above, when the PLL output clock is used as a LAN system clock, the internal clock frequency divider is cleared at the timing of the period of the PLL output clock so that a phase shift between the PLL output clock and the internal clock divider output clock can be reduced. As a result, the phase shift (step) of the system clock to be caused at the time of switching from the PLL output clock to the internal clock divider output clock, can be reduced.

On the other hand, when the internal clock divider output clock is used as the LAN system clock, the external clock frequency divider is cleared at the timing of the period of the PLL output clock synchronized with the internal clock divider output clock and having a reduced phase shift from the internal clock divider output clock, so that a phase shift between the internal clock divider output clock and the external clock can be reduced. As a result, the phase shift (step) of the clock to be input to PLL and to occur at the time of switching from the internal clock divider output clock to the external clock, can be reduced. Since the operation of PLL following the phase change can be suppressed, the phase shift of the system clock can be reduced.

As described above, the phase shift can be reduced at the time of switching from the PLL output clock to the internal clock divider output clock or vice versa, thereby always providing the system clock that is stable in both the frequency and phase.

DESCRIPTION OF THE PREFERRED EMBODIMENTS

Embodiments of a method and apparatus for controlling the phase of a system clock according to the present invention will be described with reference to the accompanying drawings.

Figure 1:
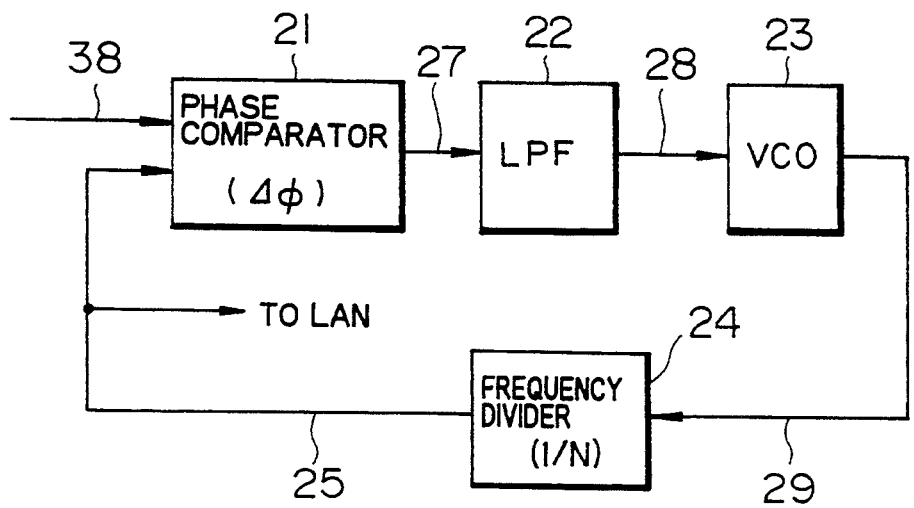
FIG. 1 is a block diagram showing an example of the structure of PLL.
Figure 2:
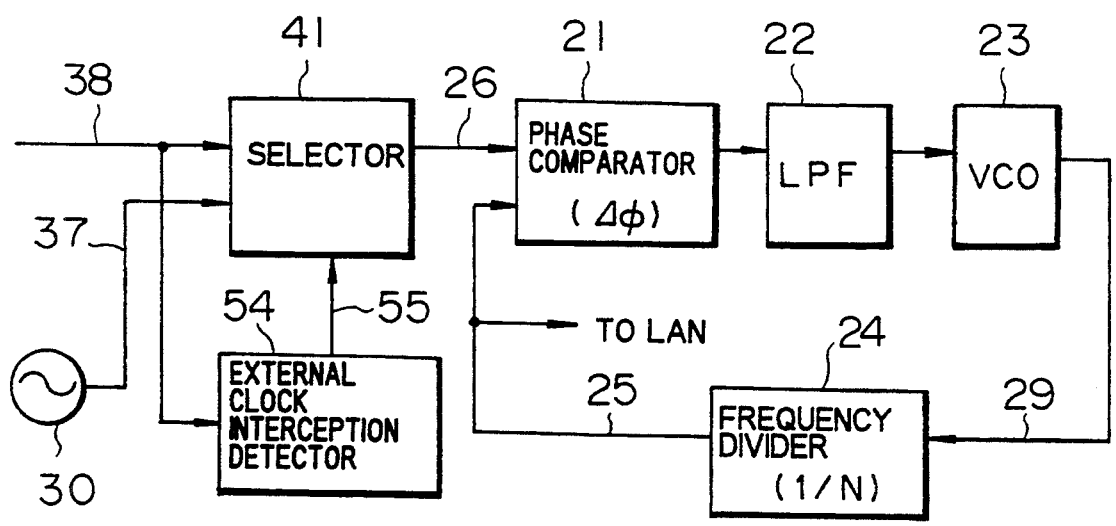
FIG. 2 is a block diagram showing an example of a conventional system clock generating circuit.
Figure 3:
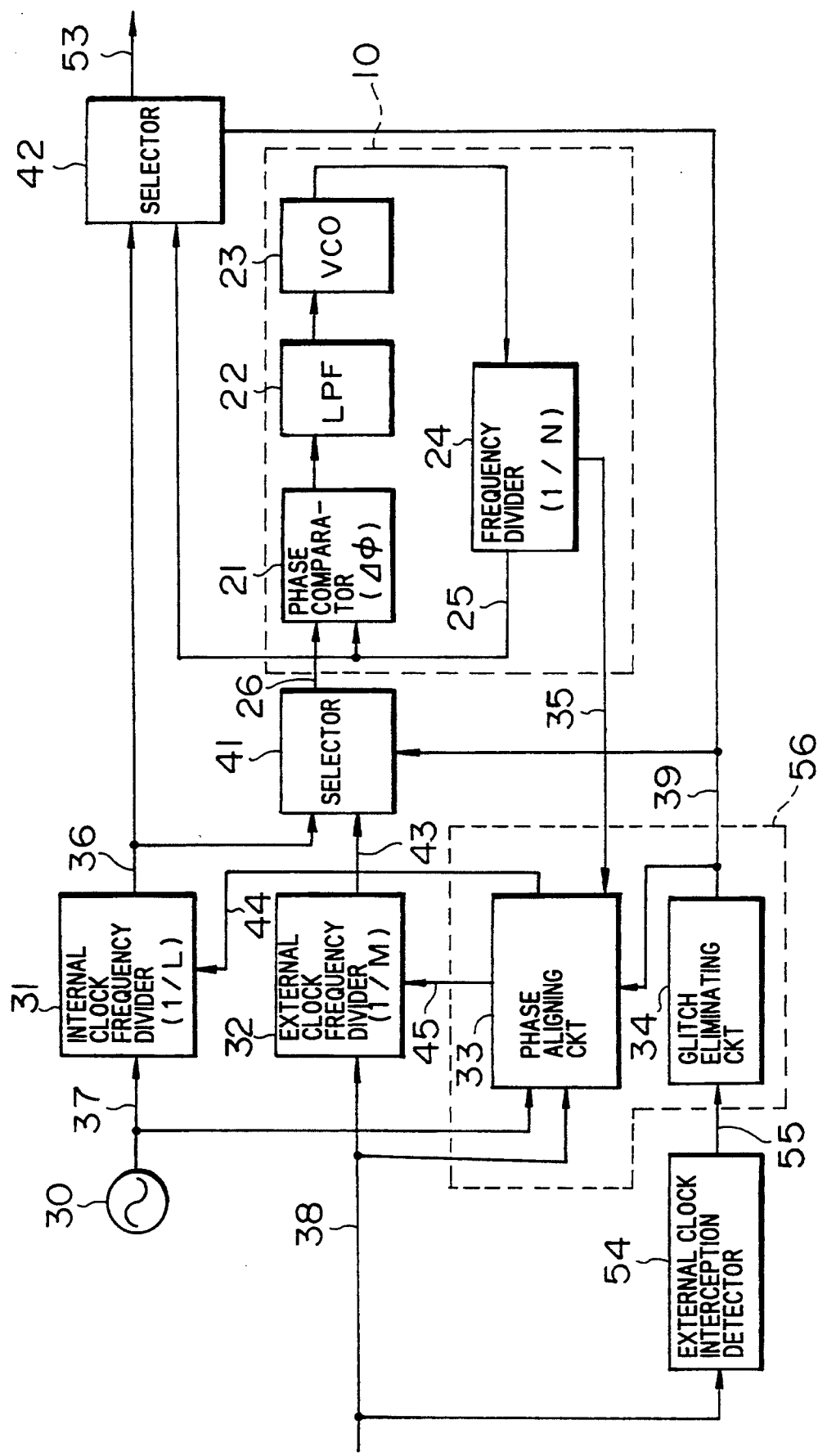
FIG. 3 is a block diagram showing the structure of a system clock phase controlling apparatus according to an embodiment of the present invention.
Figure 4:
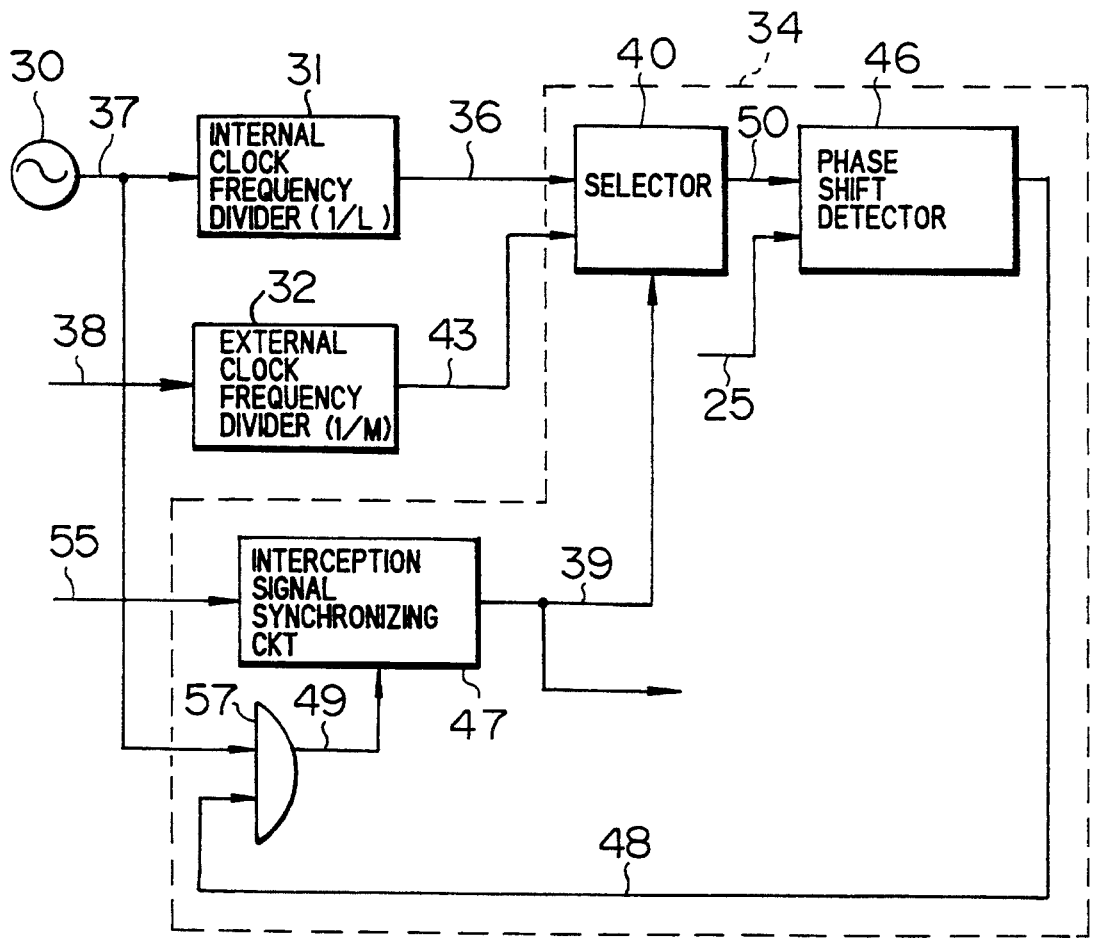
FIG. 4 is a block diagram showing an example of the structure of the glitch eliminating circuit shown in FIG. 3.
Figure 6:
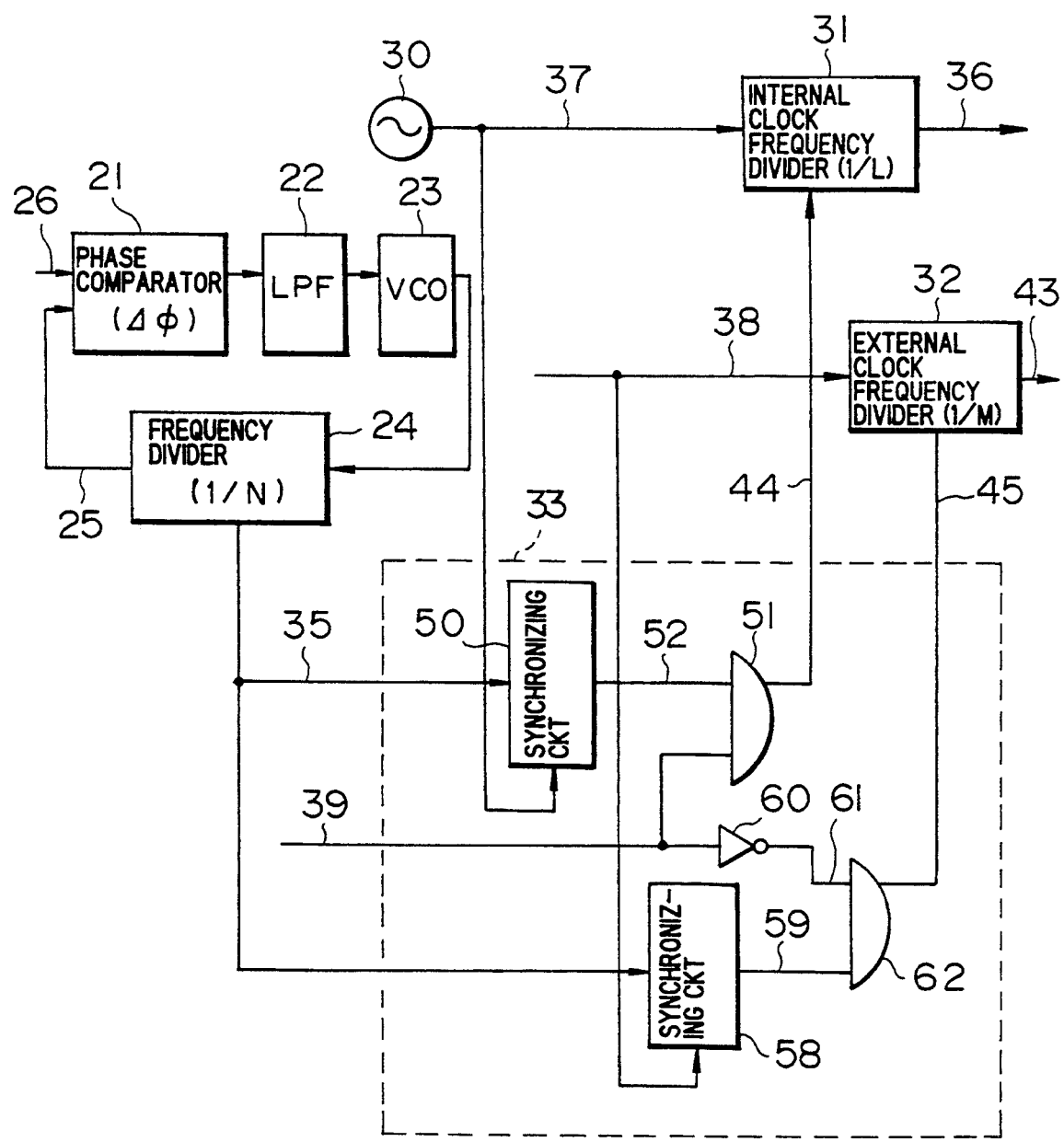
FIG. 6 is a block diagram showing an example of the structure of the phase aligning circuit shown in FIG. 4.
Figure 7:
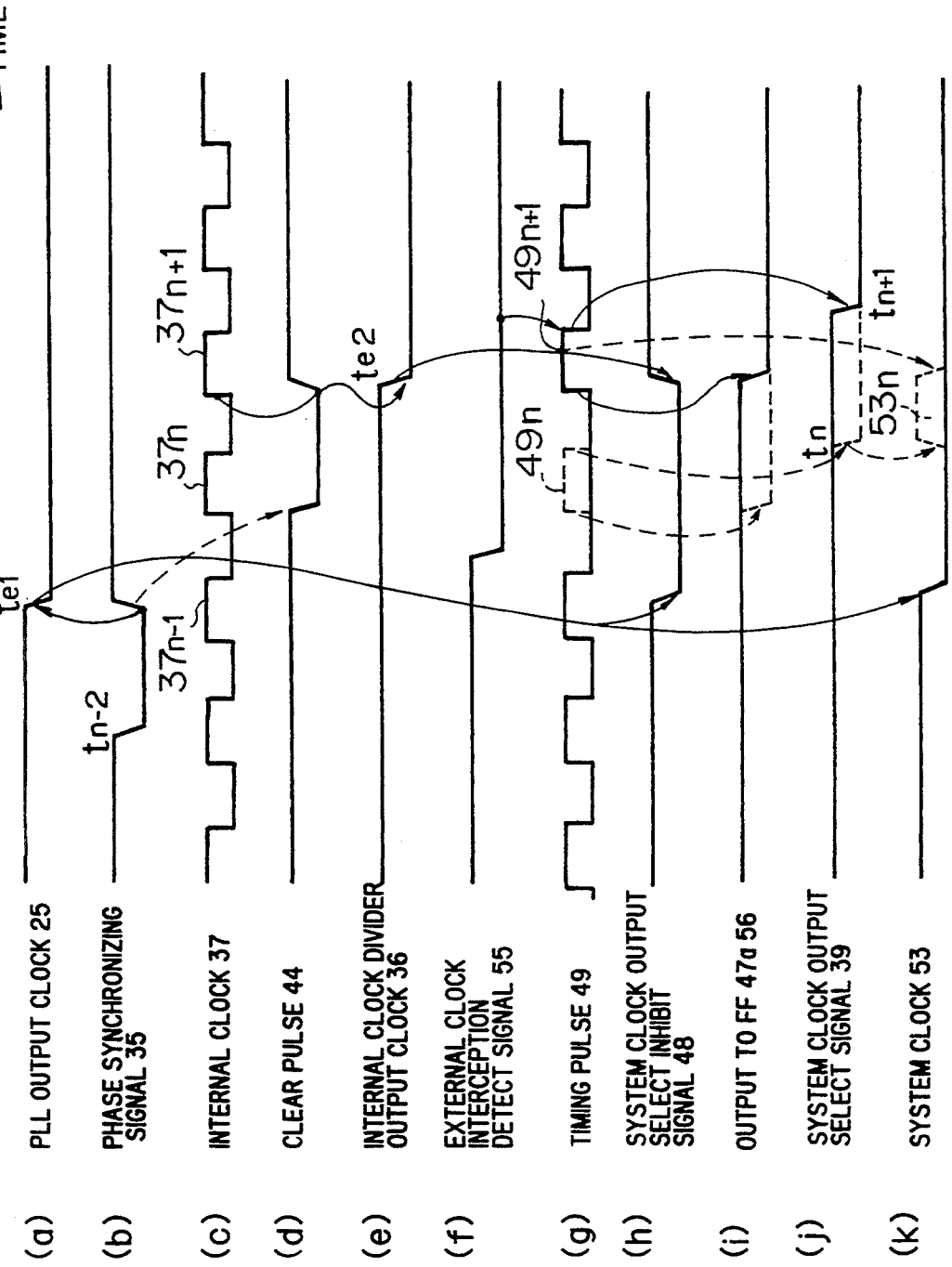
FIG. 7 is a timing chart explaining the operation of the phase controller shown in FIGS. 3 to 6.

FIG. 3 is a block diagram showing the structure of an embodiment of the apparatus for controlling the phase of a system clock according to the present invention. FIG. 4 is a block diagram showing the structure of the glitch eliminating circuit shown in FIG. 3. FIG. 6 is a block diagram showing the structure of the phase aligning circuit shown in FIG. 4. FIG. 7 is a timing chart explaining the operation of the phase controller shown in FIGS. 3 to 6.

In the embodiment shown in FIG. 3, a frequency synthesizer 10 is a PLL for example. An internal clock frequency divider 31 having a division ratio of L (an integer) divides clocks 37 (hereinafter called internal clocks) from a standard clock oscillator within a system, i.e., internal clock oscillator 30, by using its frequency divider counter, and generates system protecting clocks 36 (hereinafter called internal clock divider output clocks). An external clock frequency divider 32 having a division ratio of M (an integer) divides external clocks 38 supplied from a standard clock oscillator outside of the system, i.e., external clock supplier (not shown). The divided clocks are supplied to PLL and phase-locked to generate system clocks.

A selector 42 for selecting a system clock selects a PLL output clock 25 as the system clock 53 when the external clock 38 is supplied, and selects the internal clock divider output clock 36 as the system clock when the external clock 38 is intercepted. A selector 41 for selecting an input to PLL selects the external clock divider output clock 43 as a PLL input clock 26 when the external clock 38 is supplied.

With the first embodiment shown in FIG. 3, when the external clock 38 is supplied, the PLL output clock 25 phase-locked with the external clock, and with high frequency jitters being eliminated, can be supplied to each node (not shown) of LAN, synchronizing the node with the external network.

When the external clock 38 is intercepted, the selector 41 selects as the PLL input clock 26 the internal clock divider output clock 36 in place of the external clock divider output clock 43, in response to a level change of a system output select signal 39, and supplies a clock with no frequency shift to PLL. As a result, VCO 23 of PLL will not provide a self-running oscillation, but it synchronizes with the frequency of the internal clock divider output clock. When the external clock is recovered, the selector 41 selects the external clock divider output clock 43 and supplies it to PLL, in response to a level change of the select signal 39.

With the first embodiment shown in FIG. 3, therefore, it is possible to prevent system clocks with a temporary frequency shift from being supplied to each node before PLL and external clocks are synchronized together, even if the selector 42 selects the PLL output clock 25 instead of the internal clock divider output clock 36 when the external clock 38 is recovered.

A system clock phase controller 56 enclosed by a broken line in FIG. 3 is provided according to the present invention. This controller 56 is constituted by a phase aligning circuit 33 and a glitch eliminating circuit 34. The glitch eliminating circuit 34 controls the system clock output 53 so as not to have a glitch when the system clock output 53 is switched from the PLL output clock 25 to the internal clock 36 or vice versa.

The phase aligning circuit 33 makes small a phase difference between the PLL output clock 25 and internal clock divider output clock 36 when the former is used as the system clock 53, and makes small a phase difference between the PLL output clock 25 and external clock divider output clock 43 when the latter is used as the system clock 53. It is possible therefore to control the system clock to have less phase shift when the selector 42 selects the internal clock divider output clock 36 instead of the PLL output clock 25, or vise versa.

An external clock interception detector 54 immediately changes an external clock interception detect signal 55 to represent an interception state when the external clock 38 is intercepted. In response to this signal 55, the system clock 53 is changed from the PLL output clock 25 to the internal clock divider output clock 36. With the first embodiment shown in FIG. 3, therefore, before VCO 23 of PLL enters the self-running oscillation state which has a frequency shift after the interception of the external clock 38, the system clock 53 is changed to the internal clock divider output clock 36 without frequency shift, and supplied to each node.

The external clock interception detector 54 also changes the external clock interception detect signal 55 to represent the interception release state, when the external clock 38 is recovered, while taking into account the time period during which the phase aligning circuit 33 can synchronize the phases of the PLL output clock 25 and external clock divider output clock 43.

Next, the structure and operation of the glitch eliminating circuit of the system clock phase controller 56 will be described with reference to FIG. 4.

The glitch eliminating circuit 34 is constructed of an interception signal synchronizing circuit 47, phase shift detector 46, selector 40, and AND gate 57. The interception synchronizing circuit 47 is a synchronizing circuit for the external clock interception detect signal 55, and for the control of eliminating a glitch on the system clock 53. This circuit 47 synchronizes the external clock interception detect signal 55 with the internal clock 37 and generates the system clock output select signal 39. As shown in FIG. 5B, this circuit may be constructed of flip-flops 47a and 47b and an inverter (NOT gate) 47c. The detect signal 55 is supplied to a data input D of the flip-flop 47a, and a Q output of the flip-flop 4a is supplied to a data input D of the flip-flop 47b. Supplied to a clock input T of the flip-flop 47a is a mask signal which is a system clock output select inhibit signal 48. The inhibit signal 48 is supplied via an inverter 47c to a clock input T of the flip-flop 47b. Accordingly, the level of the select signal 39 output from the synchronizing circuit 47 takes the state (level) of the detect signal at the falling edge of a timing pulse 49.

The AND gate 57 controls the supply of the timing pulse 49 to the flip-flops of the synchronizing circuit 47 for the external clock interception detect signal 55. While the system clock output select inhibit signal 48 takes the select inhibit state, the timing pulse 49 is not output from the AND 57 to prevent a level change of the system clock output select signal 39.

As particularly shown at the rows (c), (g), and (h) in the timing chart of FIG. 7, while the inhibit signal 48 takes the inhibit state, e.g., a low level, the AND gate 57 does not pass the internal clock 37. Of the timing clocks 49, a timing clock $49_n$ (indicated by a broken line at the row (g) in FIG. 7) corresponding to the internal clock $37_n$ is not output. If the timing clock $49_n$ is output, the select signal 39 (at the row (j) in FIG. 7) takes a low level at time $t_n$ in response to the falling edge of the clock $49_n$. However, since the timing clock $49_n$ is not output, the select signal 39 takes the low level in response to the falling edge of the next clock $49_{n+1}$. If the select signal 39 takes the low level at time $t_n$ as indicated by a broken line, the selector 42 selects the clock 36 as the system clock, and a glitch $53_n$ is generated as shown at the row (k) of FIG. 7. In this embodiment, however, the select signal 39 takes the low level at time $t_{n+1}$ and the glitch $53_n$ will not be generated.

Figure 5A:
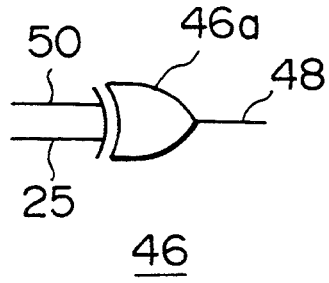
FIG. 5A is a circuit diagram showing an example of the structure of the phase shift detector shown in FIG. 4.
Figure 5B:
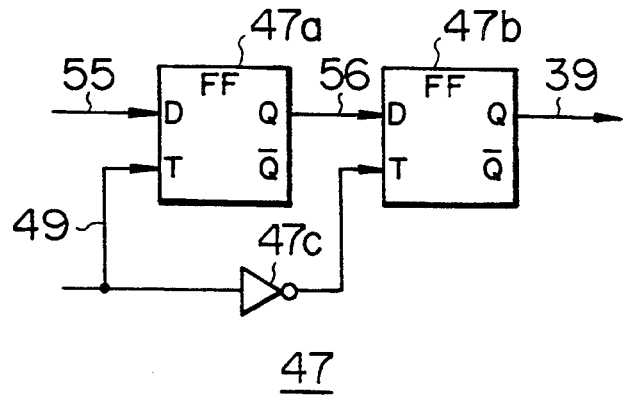
FIG. 5B is a circuit diagram showing an example of the structure of the interception signal synchronizing circuit shown in FIG. 4.

The phase shift detector 46 is constructed of, for example, an exclusive OR gate 46a shown in FIG. 5A. The phase shift detector 46 detects a phase shift between the PLL output clock 25 and external clock divider output clock 43 or internal clock divider output clock 36 to set the system clock output select inhibit signal 48 to the select inhibit state, i.e., to the low level, while there is a phase shift.

As seen from the timing chart of FIG. 7, for example, if the phase shift detector 46 detects the phase shift between the internal clock 36 and PLL output clock 25 and detects that one of the two clocks takes the low level and the other takes the high level, the phase shift detector 46 sets the inhibit signal 48 to the low level.

The selector 40 selects an input to the phase shift detector 46. The select signal for this selector 40 is the same as the system clock output select signal 39. In FIG. 3, signal path lines of the clocks 36 and 43 to the frequency dividers 31 and 32, and a signal path line of the clock 25 to the phase shift detector 46, are omitted.

When the select signal 39 takes the high level, and if the selector 42 shown in FIG. 3 selects the PLL output clock 25 as the system clock 53, the selector 40 selects the internal clock divider output clock 36 as the input signal 50 to the phase shift detector 46.

When the select signal 39 takes the low level, and if the selector 42 shown in FIG. 3 selects the internal clock divider output clock 36 as the system clock 53, the selector 40 selects the external clock divider output clock 43 as the input signal 50 to the phase shift detector 46.

Next, the structure and operation of the phase aligning circuit 33 of the system clock phase controller 56 will be described with reference to FIG. 6.

The phase aligning circuit 33 is constructed of synchronizing circuits 50 and 58, AND gates 51 and 62 for controlling to clear the frequency dividers 31 and 32, respectively, and NOT gate 60. The synchronizing circuit 50 synchronizes the phase synchronizing signal 35 (at the row (b) in FIG. 7) from the frequency divider 24 of PLL with the internal clock 37. The synchronizing circuit 50 also controls to reliably clear the internal clock frequency divider 31 to align the phases of the internal clock divider output clock 36 and PLL output clock 25 when the selector 42 selects the PLL output clock 25 as the system clock 53 upon reception of the system clock output select signal 39.

The AND gate 51 is used for controlling to clear the internal clock frequency divider 31. This AND gate 51 supplies a clear pulse 44 to the internal clock frequency divider 31 when the AND conditions between the synchronizing signal 52 from the synchronizing circuit 50 and the select signal 39 are satisfied, while the selector 42 selects the PLL output clock 25 as the system clock 53 upon reception of the system clock output select signal 39 which takes the high level.

Specifically, the synchronizing circuit 50 changes its output signal 52 level to the low level in response to the rising edge of the internal clock 37 after the phase synchronizing signal 35 (at the row (b) in FIG. 7) takes the low level at time $t_{n-2}$. As a result, the phase synchronizing signal 35 is synchronized with the internal clock 37 and output as the clear pulse 44 (at the row (d) in FIG. 7). In this manner, the synchronizing circuit 50 operates to delay one clock for the sake of synchronization.

The synchronizing circuit 58 synchronizes the phase synchronizing signal 35 from the frequency divider 24 of PLL with the external cock 38. The synchronizing circuit 58 also controls to reliably clear the external clock frequency divider 32 to align the phases of the external clock divider output clock 43 and PLL output clock 25 when the selector 42 selects the internal clock divider output clock 36 as the system clock 53 upon reception of the system clock output select signal 39 which takes the low level.

The AND gate 62 is used for controlling to clear the external clock frequency divider 32. This AND gate 62 supplies a clear pulse 45 to the external clock frequency divider 32 when the AND conditions between the synchronizing signal 59 from the synchronizing circuit 58 and the external clock 38 are satisfied, while the selector 42 selects the internal clock divider output clock 36 as the system clock 53 upon reception of the system clock output select signal 39. The operation of the synchronizing circuit 58 is similar to that of the synchronizing circuit 50, and so the description thereof is omitted.

The operation of the system clock phase controller 57 constructed as above will be described with reference to the timing chart shown in FIG. 7. In this example of the operation illustrated in FIG. 7, it is assumed that the external clock interception detector 54 detects an interception of the external clock 38 and changes the interception detect signal 55 from the external clock supply state (e.g., high level) to the interception state (low level), and this switching occurs while there is a phase shift between the PLL output clock 25 and internal clock divider output clock 36.

In the system clock phase controller 56, the phase aligning circuit 33 aligns the phases of the two clocks 25 and 36 so that the phase shift between the two clocks 25 and 36 can be suppressed considerably lower than when such a phase alignment is not performed. However, the phase shift cannot be completely eliminated because there is a phase shift caused by a delay or the like of the synchronizing circuits. As a result, as previously described, when the system clock output select signal 39 changes its level while such a phase shift is present, a glitch $53_n$ is generated on the system clock 53.

This glitch results in a temporary disability of communications between terminal equipment at each node of LAN. Since the system clock 53 is used as the clock for terminal equipment at all nodes, this communication disability propagates to the entirety of a large scale LAN.

Consider the case where the system clock phase controller 56 is constructed of only the phase aligning circuit 33. When, under the condition that the levels of the clock interception detect signal 55 and system clock output select signal 39 have the same level (e.g., high level), the clock interception detect signal 55 takes the clock interception state (e.g., low level), and the system clock output select signal 39 is switched as shown by the broken line at time $t_n$, generating the glitch 53n on the system clock 53.

According to the embodiments of the present invention, in order to reliably control the phase of a system clock, the phases of the two clocks are aligned together, and in addition, a glitch is prevented from being generated.

When the PLL output clock 25 changes from the high level to the low level, i.e., when the frequency divider 24 in PLL is cleared and returns to the initial condition, the frequency divider 24 in PLL generates a phase synchronizing pulse as the phase synchronizing signal 35 which is synchronized with the internal clock 37 by the synchronizing circuit 50 shown in FIG. 6 to obtain the clear pulse 44. This clear pulse 44 clears the internal clock frequency divider 31. As a result, the internal clock output clock 36 changes its level from the high level to the low level. With the above operations, the phases of the two clocks 25 and 36 are aligned together.

The frequency shift between the internal clock 37 and the PLL output clock 25 synchronized with the clock of the public digital network of NTT or the like, is strictly controlled. Therefore, even if the frequency of the internal clock divider output 36 is much higher than the frequency of the PLL output clock 25, the internal clock divider output clock 36 will not change from the high level to the low level prior to generating the clear pulse 44 for clearing the internal clock frequency divider 31.

Next, it is assumed that the external clock interception detect signal 55 changes from the clock supply state (high level) to the interception state (low level) while there is a phase shift between the PLL output clock 25 and the internal clock divider output clock 36. In this case, the phase shift detector 46 shown in FIG. 4 detects the phase shift between the clocks 25 and 36 and changes the system clock output select inhibit signal 48 to the select inhibited state (low level) during the period while the phase shift is present from time $t_{e1}$ to time $t_{e2}$. The timing pulse 49 (in this case, $49_n$) is prevented from being supplied to the flip-flops of the external clock interception detect signal synchronizing circuit 47.

It is therefore possible to prevent the system clock output select signal 39 from changing its state (level) from the high level to the low level while there is a phase shift between the two clocks 25 and 36 from time $t_{e1}$ to time $t_{e2}$. When the internal clock divider output clock 36 changes from the high level to the low level and the phase shift disappears, the system clock output select inhibit signal 48 takes the high level to generate the timing pulse 49 (in this case, $49_{n+1}$) to be supplied to the flip-flops of the external clock interception detect signal synchronizing circuit 47. In response to the falling edge of the timing pulse $49_{n+1}$, the system clock output select signal 39 changes from the high level to the low level at time $t_{n+1}$ synchronously with the internal clock 37. Therefore, the system clock 53 is switched from the PLL output clock 25 to the internal clock divider output clock 36.

As described previously, in the first embodiment of the present invention, the state of the system clock output select signal 39 is prevented from being switched while there is a phase shift between the two clocks 25 and 36. Accordingly, the phase of the system clock can be reliably controlled without generating a glitch on the system clock 53.

For the description of the operation after the external clock 38 is recovered and the external clock interception detect signal 55 is changed from the clock interception state (low level) to the clock supply state (high level), the internal clock 37 shown in the timing chart of FIG. 7 is replaced by the external clock 38, the internal clock divider clear signal 44 is replaced by the external clock divider clear signal 45, and the internal clock divider output clock 36 is replaced by the external clock divider output clock 43. In such a timing chart, it can be seen that the system output select signal 39 is changed from the low level to the high level. These operations are similar to the above-described case, and so the description thereof is omitted. In this manner, upon recovery of the external clock 38, the system clock 53 is changed from the clock 36 to the clock 25.

The phase alignment between the two clocks and the prevention of a glitch are also similar to the above-described case of the system clock phase control, and so the description thereof is omitted.

As described above, according to the first embodiment, while the PLL output clock 25 is used as the system clock 53, the internal clock divider output clock 36 of the frequency divider 31 is synchronized by using the clear pulse 44 generated in response to the output signal 35 from the PLL frequency divider 24. Namely, the count of the internal clock frequency divider 31 is matched to the count of the PLL frequency divider 24.

While the internal clock divider output 36 is used as the system clock 53, the external clock divider output clock 43 is synchronized by using the clear pulse 45 generated in response to the output signal 35 from the PLL frequency divider 24. Namely, the count of the external clock frequency divider 32 is matched to the count of the PLL frequency divider 24.

Figure 8:
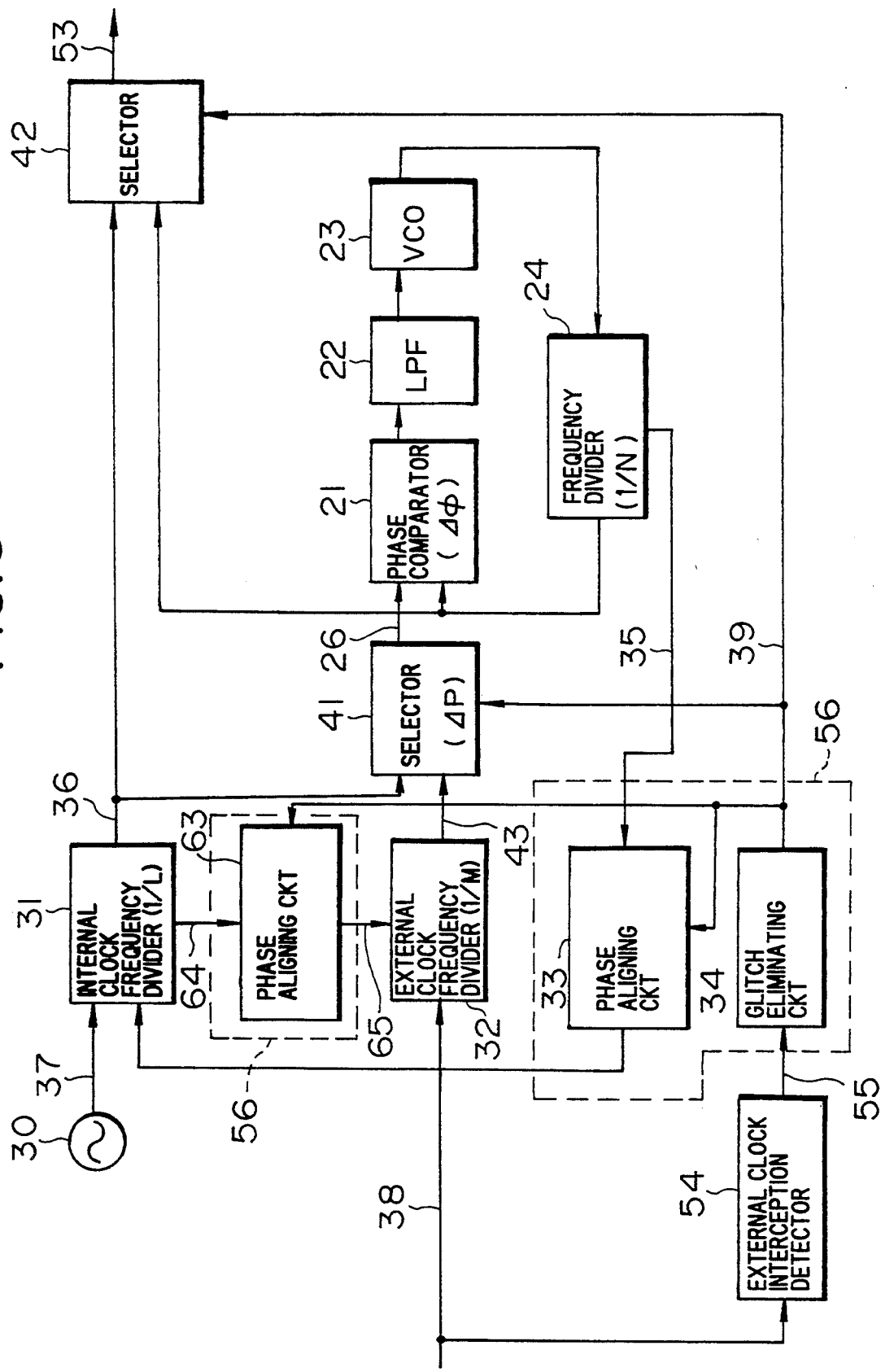
FIG. 8 is a block diagram showing the structure of the second embodiment according to the present invention.

FIG. 8 is a block diagram showing the structure of the second embodiment of the present invention. In FIG. 8, reference numeral represents a phase aligning circuit. Elements similar to those shown in FIG. 3 are represented in FIG. 8 by using identical reference numerals, and the description thereof is omitted.

In the second embodiment of the present invention, while the internal clock divider output clock 36 is used as the system clock 53, the phase aligning circuit 63 causes the count of the external clock frequency divider 32 to match the count of the internal clock frequency divider 31, so that the phases of the internal clock divider output clock 36 and external clock divider output clock 43 are aligned together. In this manner, the phase alignment can be performed when the internal clock is switched to the external clock.

In the second embodiment of the present invention, the phase alignment between the two clocks and the prevention of a glitch are similar to the first embodiment of the system clock phase control.

Figure 9:
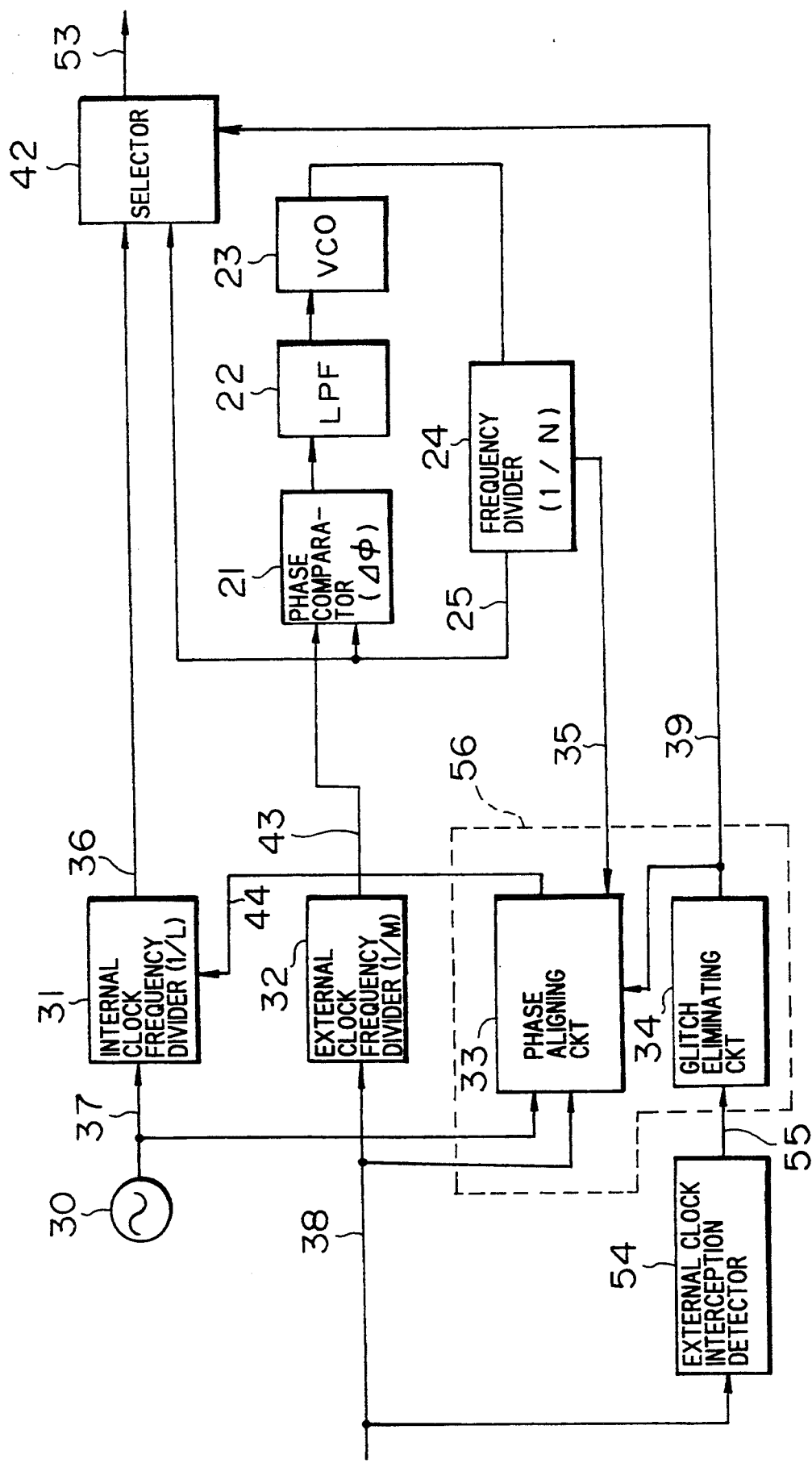
FIG. 9 is a block diagram showing the structure of the third embodiment according to the present invention.

FIG. 9 is a block diagram showing the structure of the third embodiment of the present invention. In this embodiment, the selector 41 of the first embodiment shown in FIG. 3 is not provided. In this embodiment, when the external clock is intercepted while the PLL output clock 25 generated from the clock 43 by frequency-dividing the external clock 38, the clock 36 generated by frequency-dividing the internal clock 37 is supplied as the system clock 53, similar to the first embodiment. However, in the third embodiment, even if the external 38 is recovered, switching from the clock 36 to the PLL output clock 25 is not performed.

In the third embodiment of the present invention, the phase alignment between the two clocks and the prevention of a glitch are similar to the first embodiment of the system clock phase control.

Figure 10:
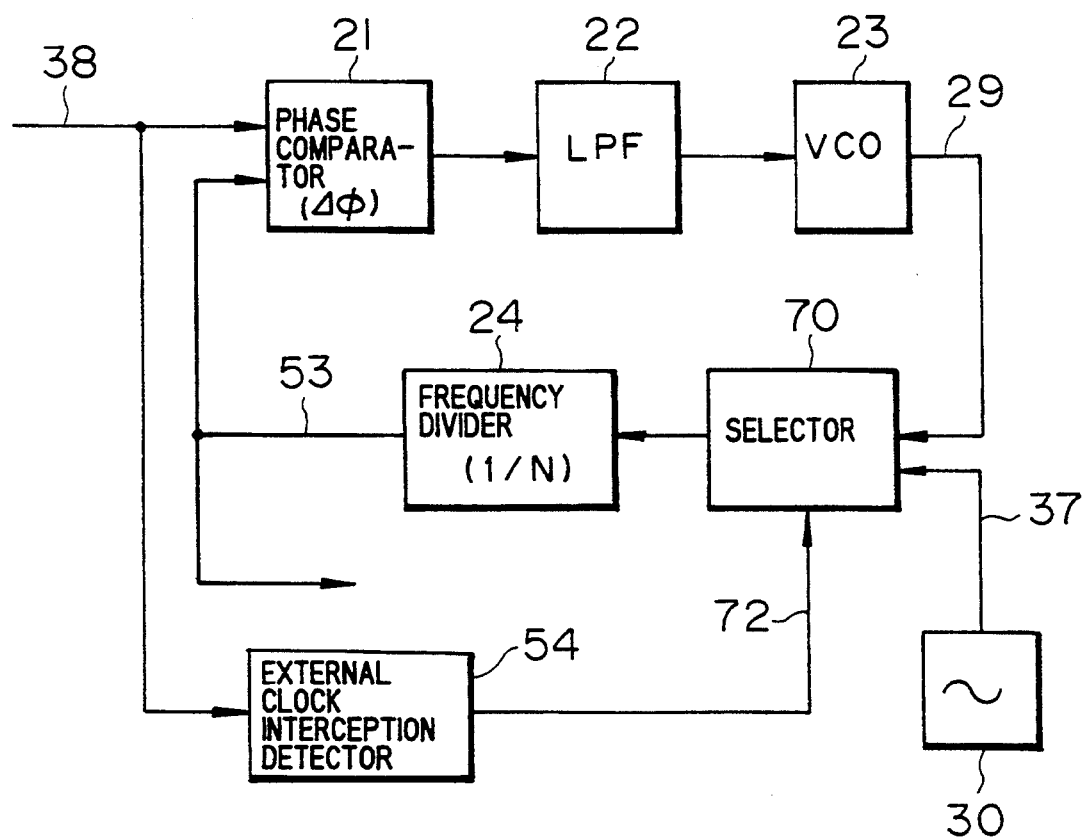
FIG. 10 is a block diagram showing the structure of the fourth embodiment according to the present invention.

FIG. 10 is a block diagram showing the structure of the fourth embodiment of the present invention.

In this embodiment, a selector 70 is provided between a VCO 23 and a frequency divider 24, for selecting one of an output 29 from VCO 23 and an output from an internal clock standard oscillator 30. This selector 70 is controlled by an output from a detector 54 for detecting an interception of the external clock 38. The standard oscillator 30 generates a signal within an allowable frequency shift range having generally the same frequency of VC0 23 synchronized with the external clock. An output clock 53 of the frequency divider 24 is supplied as the PLL internal clock for a phase comparator 21, and output as the system clock.

In the fourth embodiment constructed as above, while the external clock 38 is present, the output 29 of VCO is supplied via the selector 70 to the frequency divider 24. When the clock 38 from the external network is intercepted, the interruption detector 54 detects this state and generates a select signal 72. In response to this select signal 72, the selector 70 switches the input to the frequency divider 24 from the output 29 of VCO to the output of the standard oscillator 30.

Accordingly, an input to the frequency divider 24 is not lost irrespective of an interception of the external clock, to thereby continue the frequency division. Since the frequency of a signal from the standard oscillator 304 is set within the allowable frequency shift range, the internal clock 53 output from the frequency divider 24 is maintained within a predetermined frequency range.

When the external clock is recovered, the selector 70 selects the output 29 of VCO 23 and supplies it to the frequency divider 24, in response to the select signal 72.

In this switching between the outputs from VC0 23 and standard oscillator 30, a phase shift of 180 degrees between input signals to the frequency divider 24 at a maximum is generated. However, if the division ratio N of the frequency divider 24 is large, the phase shift at the switching hardly occurs because the phase shift is reduced by 1/N.

As described above, according to the fourth embodiment, even if there is a phase shift $\Delta\theta$ between the output 29 of VCO 23 and the internal clock 37, this phase shift is reduced by 1/N by the frequency divider 24, reducing the phase shift at the switching between the clocks 29 and 37. As a result, the system clock phase controller 56 of the first to third embodiments is not necessary, simplifying the circuit structure.

As described so far, according to one aspect of the present invention, the system clock phase is controlled at the switching of the system clock from the PLL output clock to the internal clock when the external clock is intercepted, and at the switching of the system clock from the internal clock to the PLL output clock when the external clock is recovered. Accordingly, it is possible to relax the phase step to be caused by the system clock switching, and to prevent a temporary failure such as disabled communications in a LAN or other networks. Furthermore, since a glitch eliminating control is performed at the system clock switching, the phase of the system clock can be reliably controlled.

According to another aspect of the present invention, an input to the frequency divider of PLL is arranged to be switched to the internal clock. It is therefore possible to make the phase shift at the clock switching small and to dispense with the phase controller.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A phase controlling apparatus for controlling the phase of a system clock signal, comprising:
   a first reference clock signal oscillator, provided externally of said system, for generating an external clock signal;
   a frequency synthesizer for generating a first clock signal in synchronism with said external clock signal;
   a second reference clock signal oscillator, provided internally of said system, for generating a second clock signal;
   selecting means for selecting one of said first clock signal and said second clock signal and outputting the selected clock signal to said system as a system clock signal; and
   phase controlling means for, when said system clock signal is switched by said selecting means from one of said first and second clock signals to the other clock signal thereof, setting a phase of the other of said first and second clock signals within a predetermined phase range with respect to a signal synchronized with said first clock signal.

2. A phase controlling apparatus according to claim 1, further comprising:
   delay means for delaying the switching of said system clock signal between said first and second clock signals by said selecting means for a period while there is a phase shift between said first and second clock signals.

3. A phase controlling apparatus according to claim 2, wherein said delay means generates a signal having a mask width corresponding to said period while there is a phase shift between said first and second clock signals, when said system clock signal is switched by said selecting means between said first and second clock signals, and delays the switching by said selecting means for said period in response to said signal.

4. A phase controlling apparatus according to claim 1, further comprising:
   means responsive to an interception of said external clock signal for controlling said selecting means to select said second clock signal instead of said first clock signal and outputs said second clock signal as said system clock signal.

5. A phase controlling apparatus according to claim 1, further comprising:
   means responsive to a recovery of said external clock signal for controlling said selecting means to select said first clock signal instead of said second clock signal and outputs said first clock signal as said system clock signal.

6. A phase controlling apparatus for controlling the phase of a system clock, comprising:

a first reference clock signal oscillator, provided externally of a system, for generating an external clock signal;

a second reference clock signal oscillator, provided internally of said system, for generating a second clock signal;

a phase-locked loop including:

a phase comparator, a low-pass filter, a voltage-controlled oscillator, and a frequency divider, said phase-locked loop generating a first clock signal in synchronism with said external clock signal, and outputting said first clock signal to said system;

selecting means for selecting one of said first clock signal and said second clock signal and outputting said selected clock signal to said system as a system clock signal;

phase controlling means for, when said system clock signal is switched by said selecting means from one of said first and second clock signals to the other thereof, setting a phase of the other of said first and second clock signals within a predetermined phase range with respect to a signal synchronized with said first clock signal.

7. A phase controlling apparatus according to claim 6, further comprising:

delay means for delaying the switching of said system clock signal between said first and second clock signals by said selecting means for a period while there is a phase shift between said first and second clock signals.

8. A phase controlling apparatus according to claim 7, wherein said delay means generates a signal having a mask width corresponding to said period while there is a phase shift between said first and second clock signals, when said system clock signal is switched by said selecting means between said first and second clock signals, and delays the switching by said selecting means for said period in response to said signal.

9. A phase controlling apparatus according to claim 6, further comprising:

means responsive to an interception of said external clock signal for controlling said selecting means to select said second clock signal instead of said first clock-signal and outputs said second clock signal as said system clock signal.

10. A phase controlling apparatus according to claim 6, further comprising:

means responsive to a recovery of said external clock signal for controlling said selecting means to select said first clock signal instead of said second clock signal and outputs said first clock signal as said system clock signal.

11. A phase controlling apparatus according to claim 6, further comprising:

first frequency divided means provided between said another reference clock signal oscillator provided internally of said system and said selecting means, for frequency-dividing said internal clock signal to obtain said second clock signal;

second frequency divider means for frequency-dividing said external clock signal supplied from said reference clock signal oscillator provided externally of said system; and a selector for selecting one of said first and second clock signals output from said first and second frequency divider means and supplying said selected clock signal to said phase-locked loop, wherein said phase-locked loop generates said first clock signal synchronized with said clock selected by said selector, and outputting said first clock signal to said system.

12. A phase controlling apparatus according to claim 11, further comprising:

means responsive to an interception of said external clock signal for controlling said selecting means so that said selector selects an output from said first frequency divider means instead of said second frequency divider means.

13. A phase controlling apparatus according to claim 11, further comprising:

means responsive to a recovery of said external clock signal for controlling said selecting means so that said selector selects an output from said second frequency divider means instead of said first frequency divider means.

14. A phase controlling apparatus according to claim 11, wherein said phase controlling means includes means for causing the count of said first frequency divider means to match the count of said frequency divider of said phase-locked loop, when said selecting means selects said first clock signal as said system clock signal, and causing the count of said second frequency divider means to match the count of said frequency divider of said phase-locked loop, when said selecting means selects said second clock signal as said system clock signal.

15. A phase controlling apparatus according to claim 11, wherein said phase controlling means includes means for causing the count of said second frequency divider means to match the count of said first frequency divider means, when said selecting means selects said second clock signal as said system clock signal.

16. A phase controlling apparatus for controlling the phase of a system clock, comprising:

a reference clock signal oscillator, provided externally of said system, for generating an external clock signal;

a second reference clock signal oscillator, provided internally of said system, for generating an internal clock signal;

a phase-locked loop including:

a phase comparator, a low-pass filter, a voltage-controlled oscillator, and a frequency divider, said phase-locked loop oscillating in synchronism with said external clock signal and supplying an output of said frequency divider to said system as a system clock signal; and selecting means for selecting one of an output signal from said voltage-controlled oscillator and internal clock signal and supplying said selected signal to said frequency divider.

17. A phase controlling apparatus according to claim 16, further comprising:

means responsive to an interception of said external clock signal for controlling said selecting means to select, as an input to said frequency divider, said internal clock signal instead of said output signal from said voltage-controlled oscillator.

18. A method of controlling the phase of a system clock, said method comprising the steps of:

selecting one of a first clock signal and a second clock signal and outputting said selected clock signal to a system as a system clock signal, said first clock signal being generated by a frequency synthesizer synchronized with an external clock signal supplied from a reference clock signal oscillator provided externally of said system, and said second clock signal being supplied from another reference clock signal oscillator provided internally of said system; and controlling the phases of said first and second clock signals, prior to switching between said first and second clock signals and supplying said switched clock signal to said system as said system clock signal.

19. A phase controlling method according to claim 18, further comprising the step of:

delaying said switching for a period while there is a phase shift between said first and second clock, when said system clock signal is switched between said first and second clock signals.

20. A method of controlling the phase of a system clock, said method comprising the steps of:

supplying an output of a frequency divider of a phase-locked loop including a phase comparator, a low-pass filter, a voltage-controlled oscillator, and the frequency divider, to a system as a system clock signal, said phase-locked loop oscillating synchronously with an external clock signal supplied from a reference clock signal oscillator provided externally of said system; and selecting one of an output signal from said voltage-controlled oscillator and an internal clock signal generated by a standard clock signal oscillator provided internally of said system, and supplying said selected signal to said frequency divider.

21. A phase controlling apparatus for controlling the phase of a system clock signal, comprising:

a phase-locked loop including a phase comparator for comparing a phase of a first clock signal and a phase of a second clock signal to output a signal representing a phase difference therebetween and a frequency divider for dividing a frequency of a signal based on the signal output from said phase comparator to output said first clock signal, said phase-locked loop oscillating said first clock signal in synchronism with said second clock signal;

phase control means for controlling a phase of an internal clock signal oscillated by a reference clock signal generator within said system and a phase of an external clock signal generated from another reference clock signal generator provided outside said system to output a third clock signal and a fourth clock signal, respectively;

first selecting means for selectively outputting one of said third clock signal and said fourth clock signal to said phase comparator as said second clock signal;

second selecting means for selectively outputting one of said first clock signal and said third clock signal to said system in accordance with a selecting signal; and selecting signal generating means for outputting said selecting signal indicating which one of said first and third clock signals is to be selected, wherein said first selecting means selects said fourth and third clock signals in accordance with said selecting signal and applies the selected clock signal to said phase comparator when said selecting signal instructs selection of said first and third clock signals, respectively, and wherein further said phase control means aligns phases of said internal and external clock signals with a phase of a signal synchronized with said first clock signal in accordance with said selecting signal to output the aligned signals as said third and fourth clock signals when said selecting signal instructs selection of said first and third clock signals, respectively.

22. A phase controlling apparatus according to claim 21, wherein said phase-locked loop further includes a low-pass filter, for inputting said signal representing the phase difference, and a voltage controlled oscillator for inputting an output of said low-pass filter, wherein said frequency divider inputs an output of said voltage controlled oscillator as said signal based on the signal output from said phase comparator to divide a frequency thereof.

23. A phase controlling apparatus according to claim 21, wherein said phase control means controls the phases of said internal and external clock signals to be within a predetermined phase range with respect to the phase of said signal synchronized with said first clock signal in accordance with said selecting signal to output the controlled signals as said third and fourth clock signals when said selecting signal instructs selection of said first and third clock signals, respectively.

24. A phase controlling apparatus according to claim 21, wherein said phase control means resets said internal and external clock signals in synchronism with said internal and external clock signals succeeding to said signal synchronized with said first clock signal in accordance with said selecting signal to output the reset signals as said third and fourth clock signals when said selecting signal instructs selection of said first and third clock signals, respectively.

25. A phase controlling apparatus according to claim 24, wherein said phase control means includes first and second frequency dividers for dividing frequencies of said internal and external clock signals with predetermined frequency dividing ratios and outputting the frequency divided signals as said third and fourth clock signals, and said phase control means resets said first and second frequency dividers within said predetermined phase range with respect to the phase of said signal synchronized with said first clock signal in accordance with said selecting signal to output said third and fourth clock signals when said selecting signal instructs selection of said first and third clock signals, respectively.

26. A phase controlling apparatus according to claim 21, further comprising:

means for detecting an interruption of said external clock signal and a recovery thereof, wherein said selecting signal generating means sets said selecting signal to instruct the selection of said third clock signal instead of said first clock signal in response to the detection of the interruption of said external clock signal by said detecting means.

27. A phase controlling apparatus according to claim 26, wherein said selecting signal generating means sets said selecting signal to instruct the selection of said first clock signal instead of said third clock signal in response to the detection of the recovery of said external clock signal by said detecting means.

28. A phase controlling apparatus according to claim 21, wherein said selecting signal generating means includes means for detecting a phase difference between said first clock signal and said third clock signal, and said selecting signal generating means sets said selecting signal so that, when said selecting signal instructs the switching from said first clock signal to said third clock signal, said selecting signal instructs the switching from said first clock signal to said third clock signal upon a lapse of time corresponding to said detected phase difference after the termination of said first clock signal.

29. A phase controlling apparatus according to claim 21, wherein said selecting signal generating means includes means for detecting a phase difference between said first clock signal and said fourth clock signal, and said selecting signal generating means sets said selecting signal so that, when said selecting signal instructs the switching from said third clock signal to said first clock signal, said selecting signal instructs the switching from said third clock signal to said first clock signal upon a lapse of time corresponding to said detected phase difference after the termination of said third clock signal.

30. A phase controlling apparatus for controlling the phase of a system clock signal, comprising:

a phase-locked loop including a phase comparator for comparing a phase of a first clock signal and a phase of a second clock signal to output a signal representing a phase difference therebetween and a frequency divider for dividing a frequency of a signal based on the signal output from said phase comparator to output said first clock signal, said phase-locked loop oscillating said first clock signal in synchronism with said second clock signal;

first phase control means for controlling a phase of an internal clock signal oscillated by a reference clock signal generator within said system to output a third clock signal;

second phase controlling means for controlling a phase of an external clock signal generated from a reference clock signal generator provided outside said system to output a fourth clock signal;

first selecting means for selectively outputting one of said third clock signal and said fourth clock signal to said phase comparator as said second clock signal;

second selecting means for selectively outputting one of said first clock signal and said third clock signal to said system in accordance with a selecting signal;

selecting signal generating means for outputting said selecting signal indicating which one of said first and third clock signals is to be selected; and phase control signal generating means for outputting a phase control signal responsive to a signal synchronized with said first clock signal from said frequency divider in accordance with said selecting signal to one of said first and second phase control means, wherein said first selecting means selects said fourth and third clock signals in accordance with said selecting signal and applies the selected clock signal to said phase comparator when said selecting signal instructs selection of said first and third clock signals, respectively, said phase control signal generating means supplies said phase control signal to said first and second phase control means in accordance with said selecting signal when said selecting signal instructs selection of said first and third clock signals, respectively, and said first and second phase control means align phases of said internal and external clock signals with a phase of a signal synchronized with said first clock signal in accordance with said phase control signal to output the aligned signals as said third and fourth clock signals, respectively.

31. A phase controlling apparatus according to claim 30, wherein said first and second phase control means include first and second frequency dividers for dividing frequencies of said internal and external clock signals with predetermined frequency dividing ratios and outputting the frequency divided signals as said third and fourth clock signals, respectively.

32. A phase controlling apparatus according to claim 31, wherein said phase control signal generating means resets said first and second frequency dividers within said predetermined phase range with respect to the phase of said signal synchronized with said first clock signal in accordance with said selecting signal when said selecting signal instructs selection of said first and third clock signals, respectively.

33. A phase controlling apparatus according to claim 30, wherein said phase-locked loop further includes a low-pass filter for inputting said signal representing the phase difference and a voltage controlled oscillator for inputting an output of said low-pass filter, said frequency divider inputs an output of said voltage controlled oscillator as said signal based on the signal output from said phase comparator to divide a frequency thereof.

* * * * *